United States Patent [19]
Lin et al.

[11] Patent Number: 6,066,529
[45] Date of Patent: May 23, 2000

[54] METHOD FOR ENLARGING SURFACE AREA OF A PLURALITY OF HEMI-SPHERICAL GRAINS ON THE SURFACE OF A SEMICONDUCTOR CHIP

[75] Inventors: Ping-Wei Lin, Chiayi; Jui-Ping Li, Yilan Hsien; Ming-Kuan Kao, Hsin-Chu; Yi-Fu Chung, Tainan, all of Taiwan

[73] Assignee: Mosel Vitelic Inc., Hsin-Chu, Taiwan

[21] Appl. No.: 09/198,309

[22] Filed: Nov. 23, 1998

[30] Foreign Application Priority Data

Sep. 21, 1998 [CN] China ................................ 87115723

[51] Int. Cl.⁷ ........................... H01L 21/302; H01L 21/28
[52] U.S. Cl. ........................... 438/255; 438/398; 438/753; 438/171; 438/190; 438/210; 438/488
[58] Field of Search ............................ 438/255, 398, 438/753, 964, 155, 171, 190, 210, 488

[56] References Cited

U.S. PATENT DOCUMENTS 5,726,085  3/1998  Crenshaw et al. .
5,783,495  7/1998  Li et al. .

FOREIGN PATENT DOCUMENTS 405175456  7/1993  Japan .

OTHER PUBLICATIONS

Ghandhi, S. "VLSI Fabrication Principles", John Wiley & Sons, pp. 485 and 518, 1983.

*Primary Examiner*—George Fourson
*Assistant Examiner*—Joannie A. Garcia
*Attorney, Agent, or Firm*—Winston Hsu

[57] ABSTRACT

The present invention provides a method for enlarging the surface area of hemi-spherical grains on the surface of a semiconductor chip. The hemi-spherical grain structure is formed by combining a poly-silicon layer with an underlying amorphous silicon layer. In processing, the two layers are etched with a corrosive solution that etches the amorphous silicon layer at a higher rate than it etches the poly-silicon layer. In this way, a ring-shaped slot forms at the bottom of each hemi-spherical grain thus increasing the total surface area of the hemi-spherical grain structure. Furthermore, surface area of the storage node is increased and the cell capacitor capacitance increases in excess of 15%.

11 Claims, 4 Drawing Sheets

METHOD FOR ENLARGING SURFACE AREA OF A PLURALITY OF HEMI-SPHERICAL GRAINS ON THE SURFACE OF A SEMICONDUCTOR CHIP

BACKGROUND OF THE INVENTION

1. Field of the Invention

The invention relates to a method for making hemi-spherical grains on the surface of a semiconductor chip, and more specifically, to a method for enlarging surface area of a plurality of hemi-spherical grains on the surface of a semiconductor chip.

2. Description of the Prior Art

To improve the function of a capacitor which occupys a very small volume on the surface of a semiconductor chip, the stored electric charge and cell capacitance of the capacitor can be increased by enlarging the surface area of its storage node. The storage node of a capacitor generally has a curved stack. And hemi-spherical grain (HSG) structure is extensively utilized in dynamic random access memory (DRAM) or stack DRAM to enlarge surface area of the storage node of the capacitor.

Please refer to FIG. 1 to FIG. 3. FIG. 1 to FIG. 3 show the prior art method for making HSG. As shown in FIG. 1, silane ($SiH_4$) or disilane ($Si_2H_6$) is heated and decomposed by performing low pressure chemical vapor deposition at 500 to 550° C. An amorphous silicon layer 14 with light phosphorus dopant is then evenly deposited onto the surface of the starting substrate 12 of the semiconductor chip 10 by adding phosphine ($PH_3$). The particles in the amorphous silicon layer 14 are removed by using SC-1 standard cleaning solution, and then the native oxide layer formed on the surface of amorphous silicon layer 14 is stripped off by using 1% hydrofluoric acid (HF). The semiconductor chip 10 is then placed into an ultra high vacuum chamber at 550 to 650° C. and gaseous disilane ($Si_2H_6$) is added into the chamber. The disilane seeding is deposited into the upper surface of the amorphous silicon layer 14, and this is used as a crystallization seed or nucleus (as shown in FIG. 2). Then, an annealing process is performed to transform the impregnated amorphous silicon layer 14 into a poly-silicon layer 16 with hemi-spherical grains (as shown in FIG. 3).

Before a dielectric film is deposited, a pre-cleaning step is performed. The surface of the semiconductor chip 10 is cleaned with SC-1 standard cleaning solution and 1% hydrofluoric acid (HF). After the pre-cleaning step is complete, a depositing process is performed where a capacitor having an HSG silicon layer is produced.

Please refer to FIG. 4. FIG. 4 is a perspective diagram of a semiconductor chip 30 having an HSG silicon layer. The semiconductor chip 30 comprises a silicon substrate 32, a diffusion region 34, two word lines 36, a planarized insulation layer 38, a storage node 40, a cell dielectric layer 42, and a field plate 44. The storage node 40 is formed by the method shown in FIG. 1 to FIG. 3. First, an amorphous silicon layer is deposited then filled with disilane seeding. An annealing process is then performed to form a poly-silicon layer having the HSG structure. This is the storage node of the capacitor.

SUMMARY OF THE INVENTION

It is therefore a primary objective of the present invention to provide a method for enlarging the surface area of a plurality of hemi-spherical grains on the surface of a semiconductor chip.

Briefly, in a preferred embodiment, the present invention provides a method for enlarging surface area of a hemi-spherical grain structure on the surface of a semiconductor chip, the hemi-spherical grain structure being formed by a combination of a poly-silicon layer containing a plurality of hemi-spherical grains on its upper surface and an amorphous silicon layer under the poly-silicon layer, the method comprising: etching the poly-silicon layer and amorphous silicon layer by using a corrosive solution that etches the amorphous silicon layer at a higher rate than it etches the poly-silicon layer so that the amorphous silicon layer around the bottom of each hemi-spherical grain forms a ring-shaped slot and the total surface area of the hemi-spherical grain structure is increased.

It is an advantage of the present invention that the capacitance of a cell capacitor increases more than 15% and the surface area of the storage node is enlarged.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
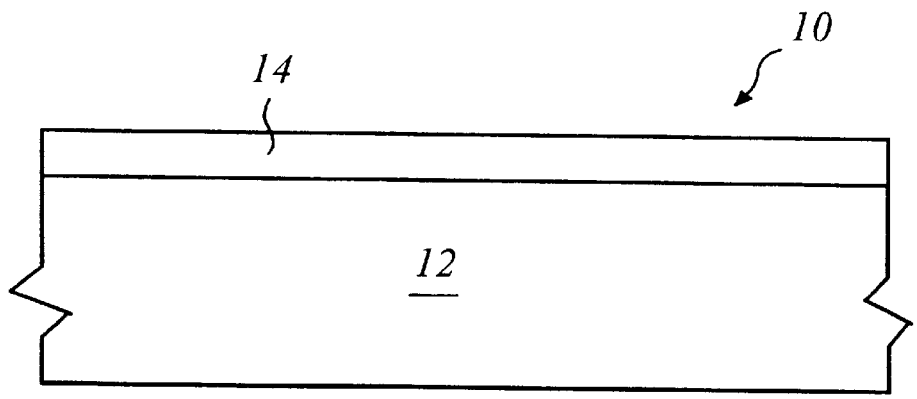
FIG. 1 to FIG. 3 show the prior art method for making HSG.
Figure 2:
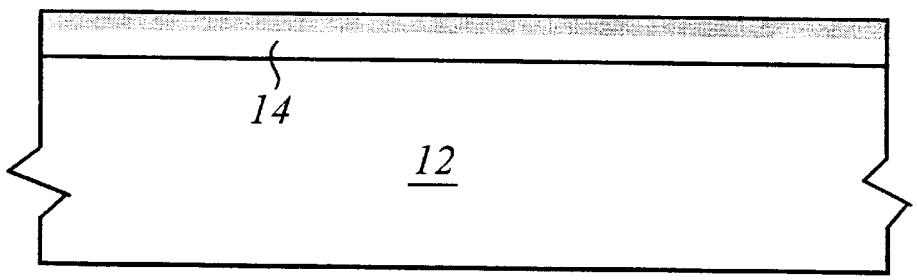
Figure 3:
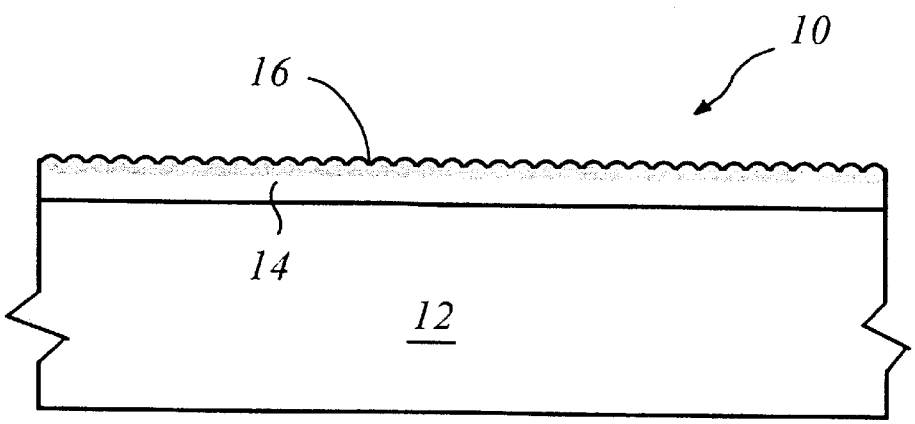
Figure 4:
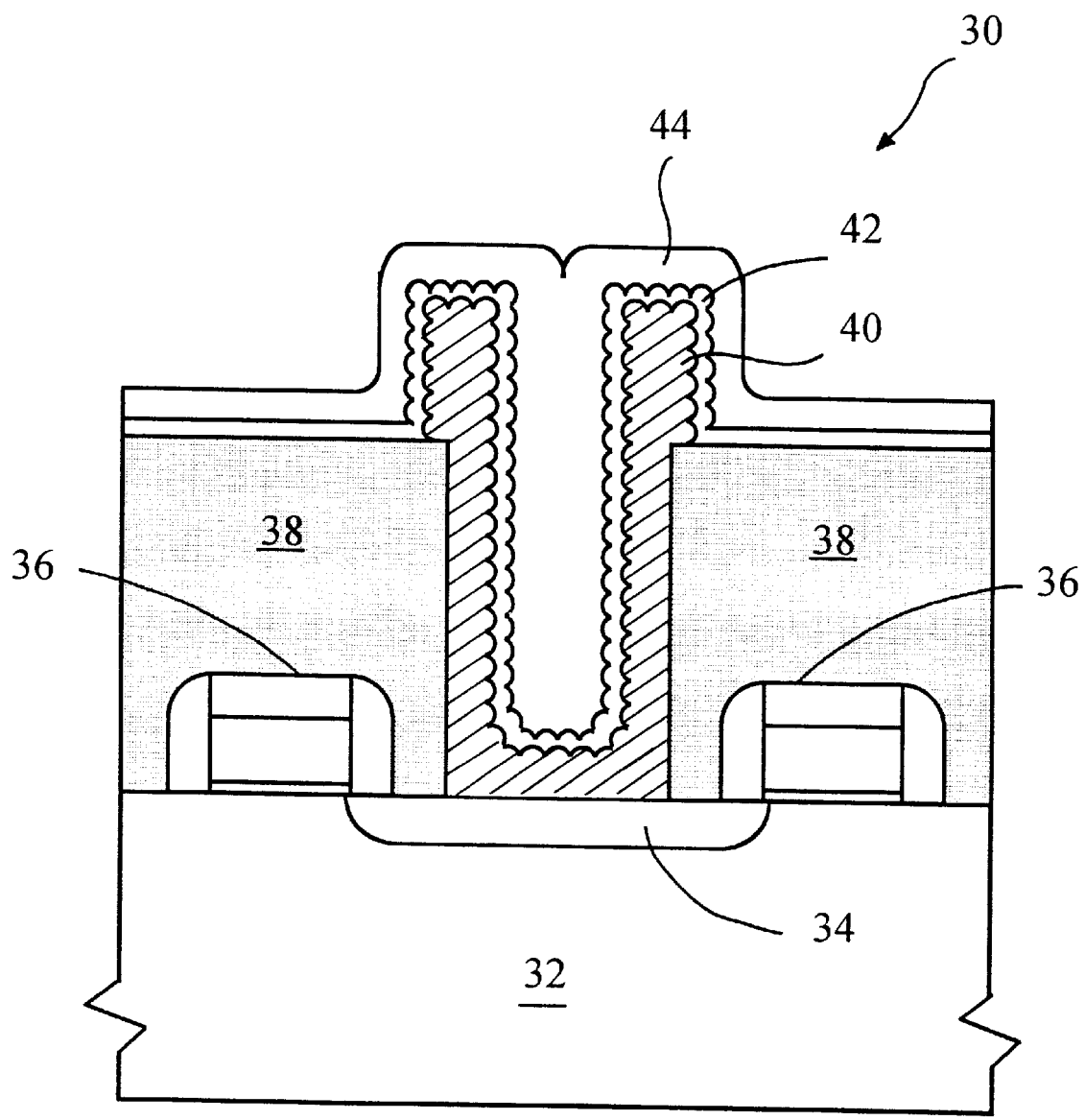
FIG. 4 is a perspective diagram of a semiconductor chip having a HSG silicon layer.
Figure 5:
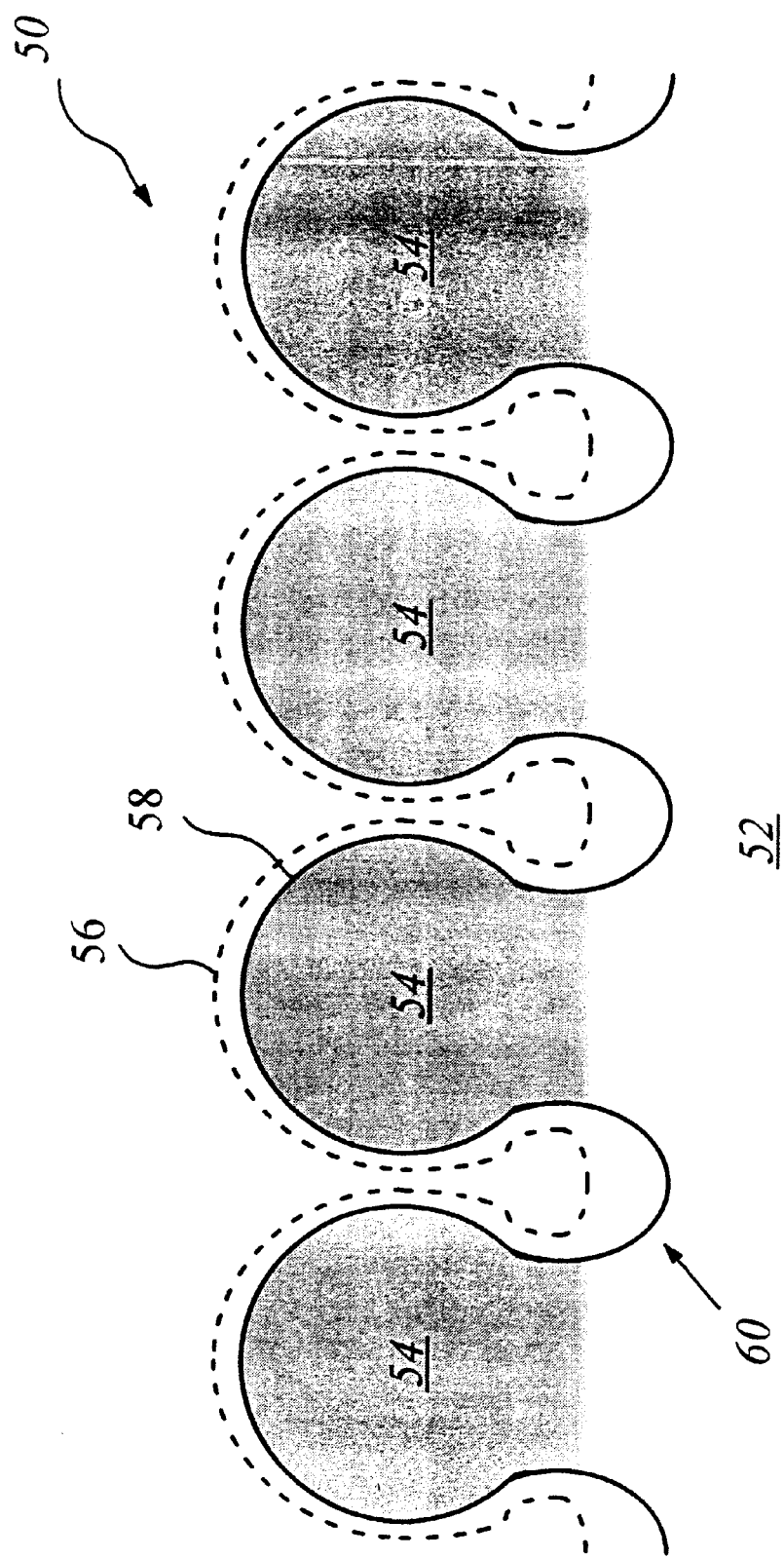
FIG. 5 is a perspective diagram of a method for making HSG according to the present invention.

Please refer to FIG. 5. FIG. 5 is a perspective diagram of a method for making HSG according to the present invention. First, a capacitor is formed according to a standard process. As shown in FIG. 4, the diffusion region 34, word lines 36, and planarized insulation layer 38 are all formed on the silicon substrate 32. When the storage node 50 is formed, an amorphous silicon layer 52 is deposited and filled with disilane seeding. Then, an annealing process is performed to form a poly-silicon layer 54 having the HSG structure.

After the HSG silicon layer 54 is formed on the surface of the amorphous silicon layer 52, a pre-cleaning step is performed. The native oxide layer on the surface of the HSG silicon layer 54 is etched and stripped with HF followed by etching of the HSG silicon layer 54 and amorphous silicon layer 52 on the surface of the semiconductor chip using $H_3PO_4$. Because $H_3PO_4$ etches the amorphous silicon layer 52 at a higher rate than it etches the poly-silicon layer 54, the amorphous silicon layer 52 around the bottom of each hemi-spherical grain forms a ring-shaped slot 60. As shown in FIG. 5, the dotted line 56 represents the surface of the HSG silicon layer 54 before etching, and line 58 represents the surface of the HSG silicon layer 54 after etching. After etching, the volume of each hemi-spherical grain is reduced. Because the amorphous silicon layer 54 around the bottom of each hemi-spherical grain forms a ring-shaped slot 60, the total surface area of the hemi-spherical grains on the surface of a semiconductor chip is enlarged.

Figure 6:
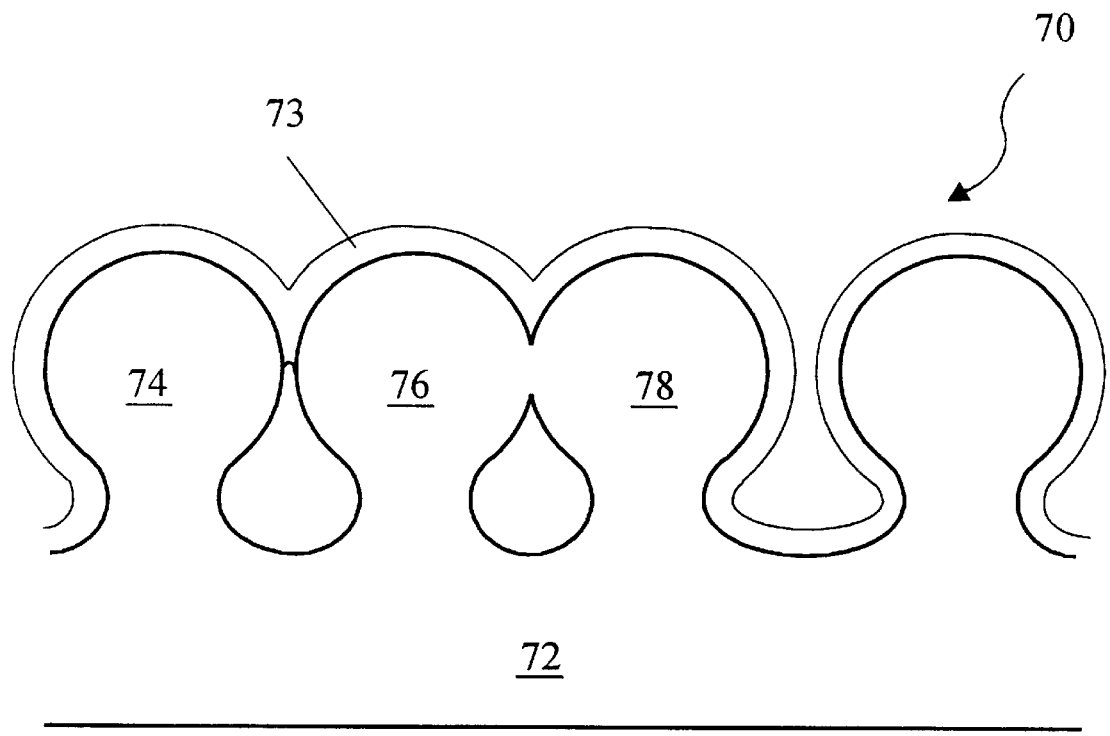
FIG. 6 is a perspective diagram of depositing a dielectric layer on the surface of the HSG layer.
Figure 7:
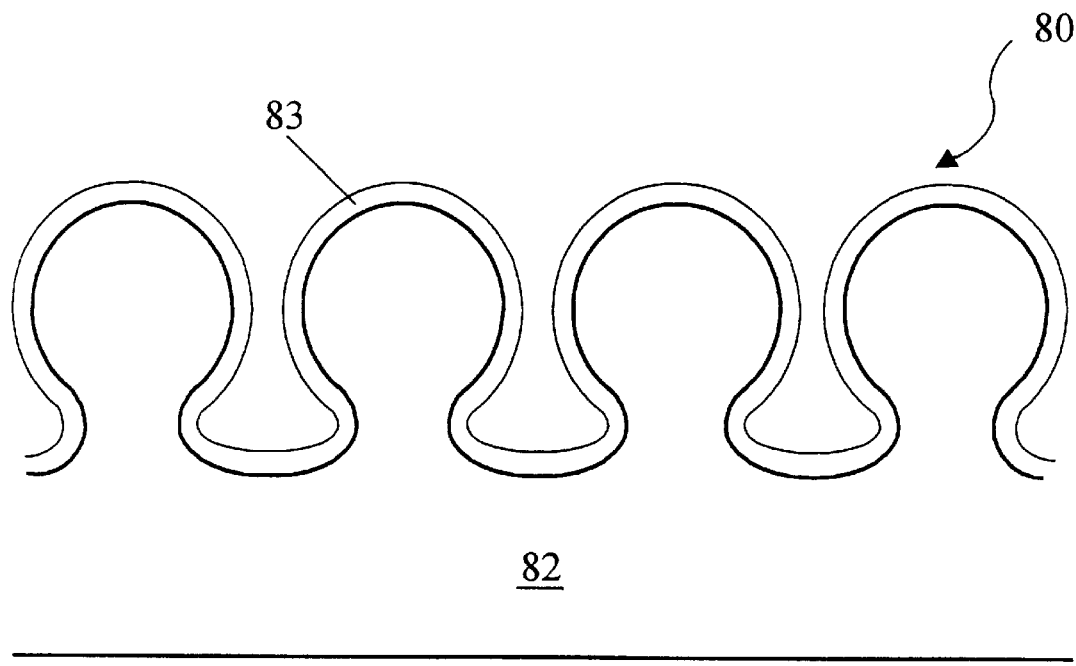
FIG. 7 is a perspective diagram of depositing a dielectric layer on the surface of the HSG layer.

Please refer to FIG. 6. FIG. 6 is a perspective diagram of the process of depositing a dielectric layer on the surface of the HSG layer. In the formation of the HSG silicon layer 70, the $Si_2H_6$ seeding is unevenly spread and the rate of formation of the hemi-spherical grains is unstable. This may lead to hemi-spherical grains forming too close to one another (e.g., hemispherical grains 74 and 76) and may even cause the grains to become adherent (e.g., hemi-spherical grains 76 and 78). The result is that it is impossible to deposit $Si_3N_4$ around the hemi-spherical grains 74, 76 and 78. In this way, surface area is lost during deposition of the $Si_3N_4$ dielectric layer 73. However, in the method of the present invention, $H_3PO_4$ is used to etch the HSG silicon layer 70 and the interface between neighboring hemi-spherical grains which are stuck together. This forms a plurality of separated hemi-spherical grains. FIG. 7 is a perspective diagram of the process of depositing a dielectric layer on the surface of the HSG layer. The $Si_3N_4$ dielectric layer 83 is evenly deposited onto the surface of the HSG layer 80 and in the space between neighboring hemi-spherical grains so that the surface area of the hemi-spherical grains on the surface of a semiconductor chip is greatly enlarged.

Finally, the HSG layer 54 and amorphous silicon layer 52 are cleaned with a SC-1 standard cleaning solution and the surface of each hemi-spherical grain of the HSG layer 54 and the surface of each ring-shaped slot 60 of the amorphous silicon layer 52 is polished and cleaned at the reduced etching rate. The SC-1 standard cleaning solution contains ammonia ($NH_4OH$), hydrogen peroxide ($H_2O_2$) and water. The relative proportion of $NH_4OH:H_2O_2:H_2O$ is 1:1:5.

Tests results show that the method for making HSG according to the present invention increases cell capacitor capacitance by more than 15% in comparison with the prior art cell capacitor.

The method for making HSG according to the present invention creates an enlarged surface area of hemi-spherical grains on the surface of a semiconductor chip by performing a post-cleaning step. Without changing the equipment, the surface area of the storage node is increased and capacitance is increased by over 15%.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for enlarging surface area of a hemi-spherical grain structure on the surface of a semiconductor chip, the hemi-spherical grain structure being formed by a combination of a poly-silicon layer containing a plurality of hemi-spherical grains on its upper surface and an amorphous silicon layer under the poly-silicon layer, the method comprising:

etching the poly-silicon layer and amorphous silicon layer by using a corrosive solution that etches the amorphous silicon layer at a higher rate than it etches the poly-silicon layer so that the amorphous silicon layer around the bottom of each hemi-spherical grain forms a ring-shaped slot and the total surface area of the hemi-spherical grain structure is increased.

2. The method of claim 1 wherein the corrosive solution also etches the interface between neighboring hemi-spherical grains which are stuck together and forms a plurality of separated hemi-spherical grains thereby increasing the total surface area of the hemi-spherical grain structure.

3. The method of claim 1 is used for forming a storage node of a capacitor.

4. The method of claim 1 wherein the semiconductor chip further comprises a native oxide layer on the surface of the poly-silicon layer and prior to etching the poly-silicon layer and amorphous silicon layer, the method further comprises:

stripping off the native oxide layer on the surface of the poly-silicon layer by using an organic solution.

5. The method of claim 4 wherein the organic solution comprises hydrofluoric acid (HF).

6. The method of claim 1 wherein the corrosive solution comprises phosphoric acid ($H_3PO_4$).

7. The method of claim 6 wherein after etching the poly-silicon layer and amorphous silicon layer, the method further comprises:

using another corrosive solution to polish and clean the surface of each of the hemi-spherical grains and the ring-shaped slots.

8. The method of claim 7 wherein said another corrosive solution contains ammonia ($NH_4OH$), hydrogen peroxide ($H_2O_2$) and water.

9. The method of claim 1 wherein the corrosive solution comprises a first corrosive solution and a second corrosive solution, the method comprises:

using the first corrosive solution to etch the poly-silicon layer and amorphous silicon layer so as to form the ring-shaped slot on the amorphous silicon layer around the bottom of each of the hemi-spherical grains;

using the second corrosive solution to polish and clean the surface of each of the hemi-spherical grains and the ring-shaped slots.

10. The method of claim 9 wherein the first corrosive solution comprises phosphoric acid ($H_3PO_4$).

11. The method of claim 9 wherein the second corrosive solution contains ammonia ($NH_4OH$), hydrogen peroxide ($H_2O_2$) and water.

* * * * *